US 8,174,061 B2

(12) United States Patent
Mouli et al.

(10) Patent No.: US 8,174,061 B2
(45) Date of Patent: *May 8, 2012

(54) FLOATING-GATE STRUCTURE WITH DIELECTRIC COMPONENT

(75) Inventors: Chandra Mouli, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 475 days.

This patent is subject to a terminal disclaimer.

(21) Appl. No.: 12/364,809

(22) Filed: Feb. 3, 2009

(65) Prior Publication Data
US 2009/0134443 A1 May 28, 2009

Related U.S. Application Data

(63) Continuation of application No. 11/155,197, filed on Jun. 17, 2005, now Pat. No. 7,485,526.

(51) Int. Cl.
*H01L 29/788* (2006.01)
(52) U.S. Cl. ...... 257/315; 257/317; 257/321; 257/E29.3
(58) Field of Classification Search .................. 257/88, 257/315, 317, 321, E29.3
See application file for complete search history.

(56) References Cited

U.S. PATENT DOCUMENTS

| 6,090,666 | A | 7/2000 | Ueda et al. | |
|---|---|---|---|---|
| 6,140,181 | A | 10/2000 | Forbes et al. | |
| 6,144,062 | A * | 11/2000 | Mine et al. | 257/317 |
| 6,656,792 | B2 | 12/2003 | Choi et al. | |
| 6,674,133 | B2 * | 1/2004 | Chang | 257/391 |
| 6,756,272 | B1 | 6/2004 | Nakagawa | |
| 6,924,969 | B2 | 8/2005 | Hill | |
| 7,485,526 | B2 * | 2/2009 | Mouli et al. | 438/257 |
| 7,547,952 | B2 * | 6/2009 | Metzner et al. | 257/411 |
| 2004/0130941 | A1 | 7/2004 | Kan et al. | |
| 2005/0112820 | A1 | 5/2005 | Chen et al. | |
| 2005/0185466 | A1 | 8/2005 | Prall | |

OTHER PUBLICATIONS

T.C. Chang et al.; Quasisuperlattice storage: A concept of multilevel charge storage; Jul. 12, 2004; Applied Physics Letters, vol. 85 No. 2; pp. 248-250.

* cited by examiner

*Primary Examiner* — Michael Trinh
(74) *Attorney, Agent, or Firm* — Leffert Jay & Polglaze, P.A.

(57) ABSTRACT

Floating-gate memory cells having a floating gate with a conductive portion and a dielectric portion facilitate increased levels of charge trapping sites within the floating gate. The conductive portion includes a continuous component providing bulk conductivity to the floating gate. The dielectric portion is discontinuous within the conductive portion and may include islands of dielectric material and/or one or more contiguous layers of dielectric material having discontinuities.

26 Claims, 7 Drawing Sheets

FLOATING-GATE STRUCTURE WITH DIELECTRIC COMPONENT

RELATED APPLICATIONS

This application is a continuation of U.S. patent application Ser. No. 11/155,197 (now U.S. Pat. No. 7,485,526), filed Jun. 17, 2005 and titled "FLOATING-GATE STRUCTURE WITH DIELECTRIC COMPONENT," which is commonly assigned and incorporated by reference in its entirety herein.

TECHNICAL FIELD

The present invention relates generally to semiconductor memory devices, and in particular, the present invention relates to floating-gate memory devices having a dielectric component.

BACKGROUND

Memory devices are typically provided as internal storage areas in the computer. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as Flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features. Flash memory is further popular as removable mass storage devices, such as memory cards used in digital cameras and the like as well as USB flash memory drives.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

To meet demands for higher capacity memories, designers continue to strive for decreasing the size of individual memory cells. However, as device size decreases, the ability to store charge also generally decreases as the size of the floating gate becomes smaller.

For the reasons stated above, and for other reasons stated below which will become apparent to those skilled in the art upon reading and understanding the present specification, there is a need in the art for alternative memory device structures and methods of forming memory devices.

DETAILED DESCRIPTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims and equivalents thereof.

Figure 1:
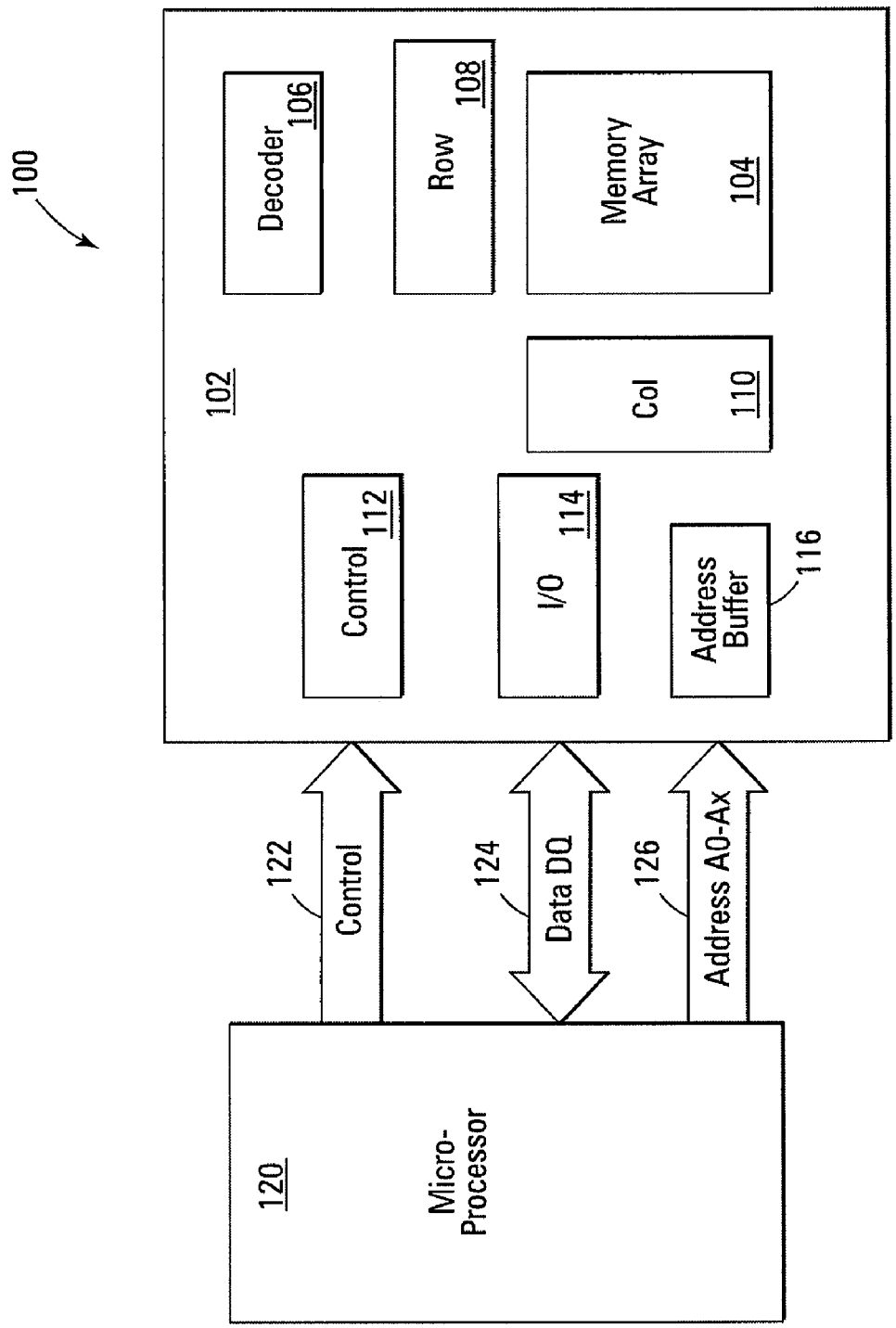
FIG. 1 is a simplified block diagram of a memory system in accordance with an embodiment of the invention.

FIG. 1 is a simplified block diagram of a memory system 100, according to an embodiment of the invention. Memory system 100 includes an integrated circuit flash memory device 102 that includes an array of floating-gate memory cells 104, an address decoder 106, row access circuitry 108, column access circuitry 110, control circuitry 112, Input/Output (I/O) circuitry 114, and an address buffer 116. Memory system 100 includes an external microprocessor 120, or memory controller, electrically connected to memory device 102 for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention. The memory array 104 includes memory cells having floating gates in accordance with the invention. The memory array 104 can include a variety of architectures, such as a NAND architecture or a NOR architecture.

Figure 2:
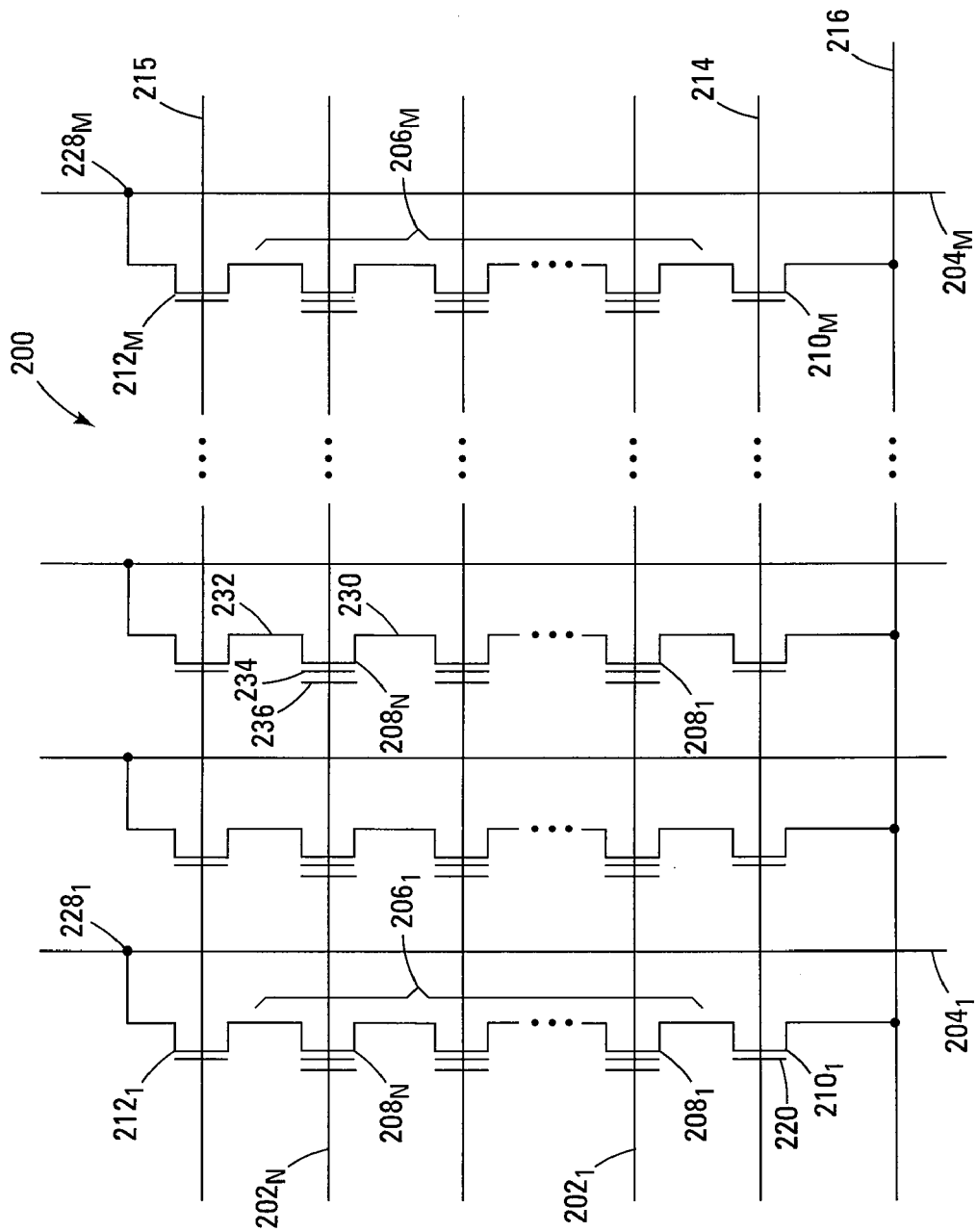
FIG. 2 is a schematic of a NAND memory array in accordance with an embodiment of the invention.

FIG. 2 is a schematic of a NAND memory array 200 as a portion of memory array 104 of FIG. 1 in accordance with another embodiment of the invention. As shown in FIG. 2, the memory array 200 includes word lines $202_1$ to $202_N$ and intersecting local bit lines $204_1$ to $204_M$. For ease of addressing in the digital environment, the number of word lines 202 and the number of bit lines 204 are each some power of two, e.g., 256 word lines 202 by 4,096 bit lines 204. The local bit lines 204 are coupled to global bit lines (not shown) in a many-to-one relationship.

Memory array 200 includes NAND strings $206_1$ to $206_M$. Each NAND string includes floating-gate transistors $208_1$ to $208_N$, each located at an intersection of a word line 202 and a local bit line 204. The floating-gate transistors 208 represent non-volatile memory cells for storage of data. The floating-gate transistors 208 of each NAND string 206 are connected in series source to drain between a source select gate 210, e.g., a field-effect transistor (FET), and a drain select gate 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate 220 of each source select gate 210 is connected to source select line 214.

The drain of each drain select gate 212 is connected to a local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202.

Figure 3:
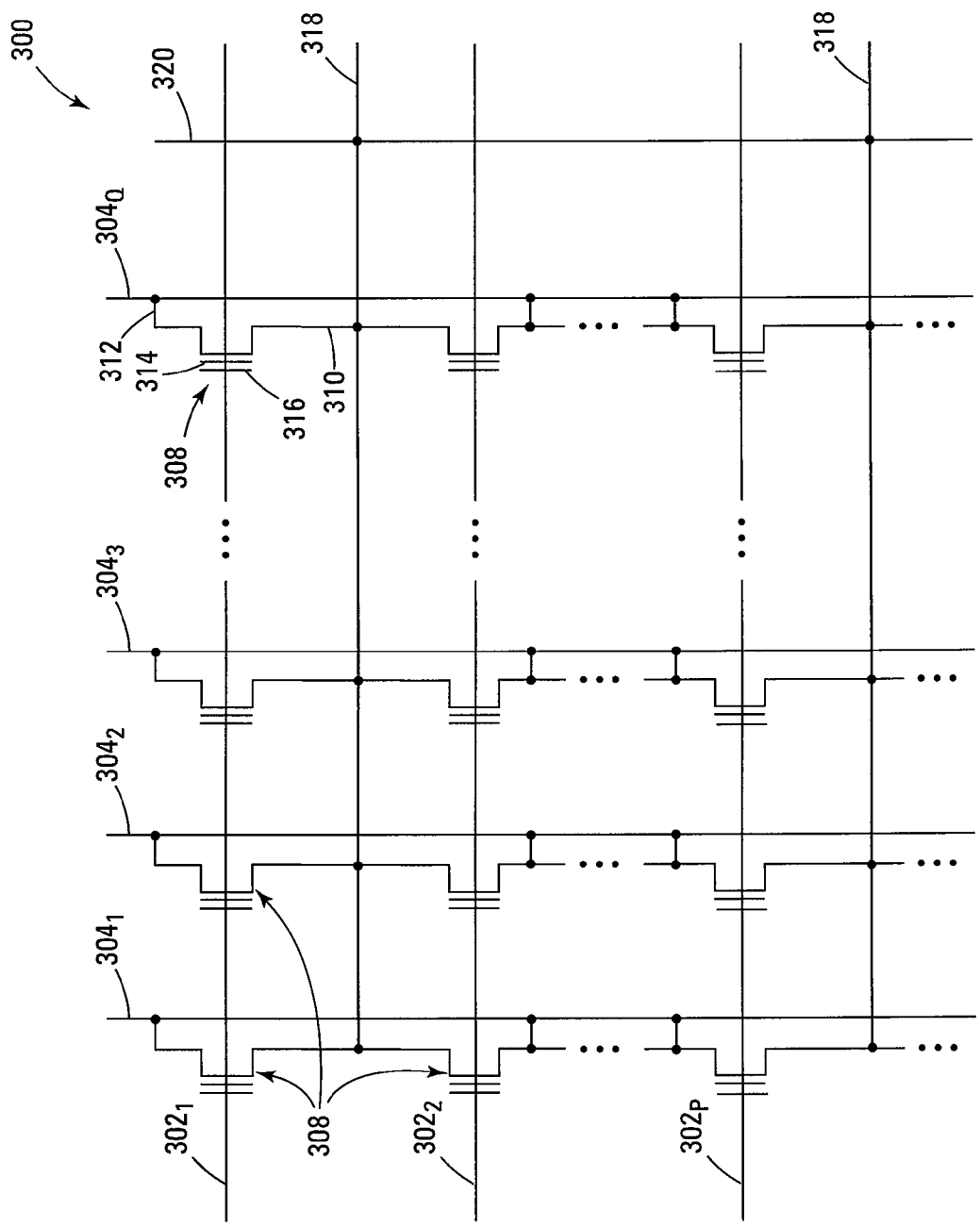
FIG. 3 is a schematic of a NOR memory array in accordance with an embodiment of the invention.

FIG. 3 is a schematic of a NOR memory array 300 as a portion of memory array 104 of FIG. 1 in accordance with another embodiment of the invention. Memory array 300 includes word lines $302_1$ to $302_P$ and intersecting local bit lines $304_1$ to $304_Q$. For ease of addressing in the digital environment, the number of word lines 302 and the number of bit lines 304 are each some power of two, e.g., 256 word lines 302 by 4,096 bit lines 304. The local bit lines 304 are coupled to global bit lines (not shown) in a many-to-one relationship.

Floating-gate transistors 308 are located at each intersection of a word line 302 and a local bit line 304. The floating-gate transistors 308 represent non-volatile memory cells for storage of data. Typical construction of such floating-gate transistors 308 includes a source 310 and a drain 312, a floating gate 314, and a control gate 316.

Floating-gate transistors 308 having their control gates 316 coupled to a word line 302 typically share a common source depicted as array source 318. As shown in FIG. 3, floating-gate transistors 308 coupled to two adjacent word lines 302 may share the same array source 318. Floating-gate transistors 308 have their drains 312 coupled to a local bit line 304. A column of the floating-gate transistors 308 includes those transistors commonly coupled to a given local bit line 304. A row of the floating-gate transistors 308 includes those transistors commonly coupled to a given word line 302.

To reduce problems associated with high resistance levels in the array source 318, the array source 318 may be regularly coupled to a metal or other highly conductive line to provide a low-resistance path to ground. The array ground 320 serves as this low-resistance path.

Figure 4:
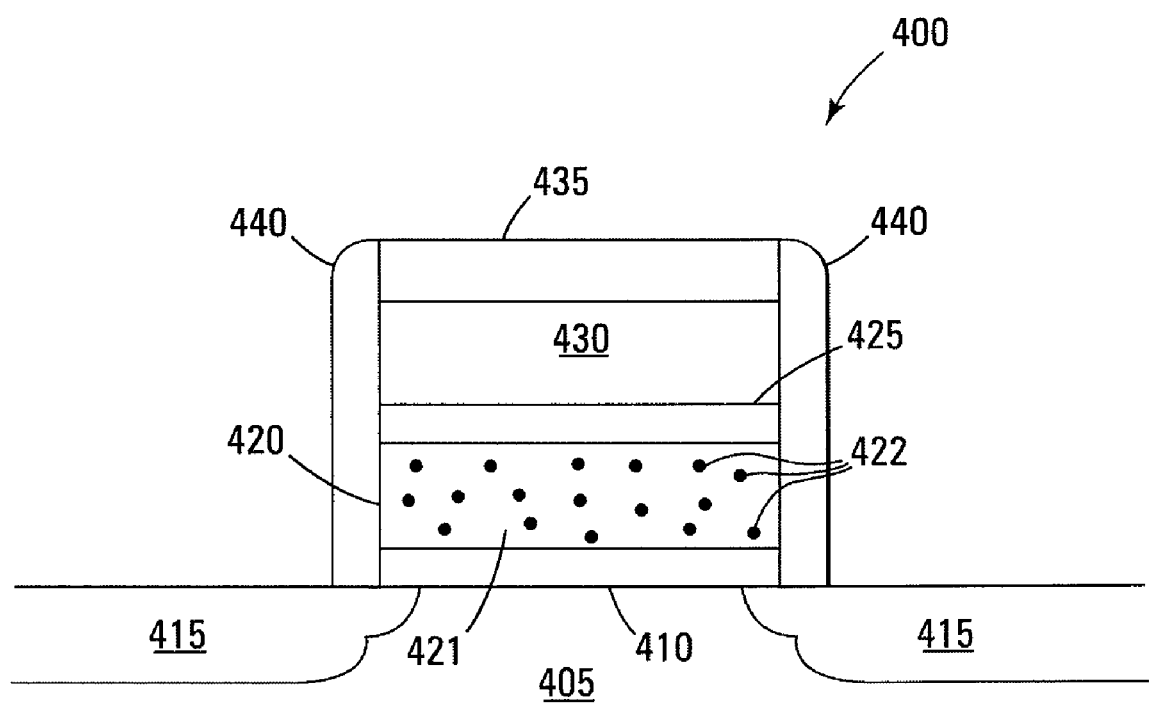
FIG. 4 is a cross-sectional view of a memory cell in accordance with an embodiment of the invention.

FIG. 4 is a cross-sectional view of a floating-gate transistor or memory cell 400 in accordance with an embodiment of the invention. The memory cell 400 is formed on a semiconductor substrate 405. For one embodiment, the substrate 405 is a monocrystalline silicon substrate. For a further embodiment, substrate 405 is a p-type monocrystalline silicon substrate.

The tunnel dielectric layer 410 is formed overlying an active region of the substrate 405, over which memory cells will be formed. The tunnel dielectric layer 410 might be formed by thermal oxidation of the silicon substrate 405. Alternatively, the tunnel dielectric layer 410 could be formed by a blanket deposition of a dielectric material, such as by chemical vapor deposition (CVD) or physical vapor deposition (PVD). Tunnel dielectric layer 410 is generally a silicon oxide ($SiO_2$), but may include other dielectric materials, including silicon nitride ($Si_3N_4$) and silicon oxynitrides ($Si_xO_yN_z$) as well as high-K dielectrics such as $HfO_2$, $ZnO_2$, $Al_2O_3$, etc.

Source/drain regions 415 are formed in the substrate 405 generally adjacent the tunnel dielectric layer 410. A channel region of the memory cell 400 is defined by the area of the substrate 405 between the source/drain regions 415. Source/drain regions 415 will generally have a conductivity type opposite the conductivity type of the substrate 405. For example, for a p-type substrate 405, the source/drain regions 415 might have an n-type conductivity.

A floating-gate layer 420 is formed overlying the tunnel dielectric layer 410. The floating-gate layer 420 is one or more layers of material that will store the charge indicative of a programmed state of the floating-gate memory cell 400. The floating-gate layer 420 contains a substantially continuous component 421 and a substantially discontinuous portion 422. In general, the continuous component 421 is a conductive material while the discontinuous component 422 is a dielectric material. With the conductive material being continuous while the dielectric material is discontinuous, the floating-gate layer 420 is a conductive layer, both vertically and horizontally. In effect, the discontinuous component 422 serves to increase an effective surface area of the continuous component 421. For one embodiment, the continuous component 421 contains a conductively-doped polysilicon layer, such as a p+ or n+ polysilicon, or other silicon-based material. For another embodiment, the continuous component contains a silicon-germanium material ($Si_xGe_{(1-x)}$). For a further embodiment, the silicon-germanium material is doped, e.g., having a p+ or n+ conductivity. For a still further embodiment, the continuous component includes one or more metals, metal nitrides, metal silicides, metal carbides or the like. For example, the continuous component may include titanium nitride (TiN), tungsten (W), tungsten nitride (WN), tantalum nitride (TaN), platinum (Pt), ruthenium (Ru), cobalt silicide (CoSi), titanium silicide (TiSi), nickel silicide (NiSi), titanium carbide (TiC), tantalum carbide (TaC), tantalum carbon nitride ($TaC_xN_y$), titanium carbon nitride ($TiC_xN_y$), etc. For one embodiment, the discontinuous component 422 contains dielectric oxides or nitrides of the continuous component 421, e.g., silicon oxide, silicon nitride or silicon oxynitride. For another embodiment, the discontinuous component 422 contains a dielectric material not derived from the material of the continuous component 421, e.g., dielectric metal oxides, such as barium strontium titanate (BST), lead zirconium titanate (PZT) and lead lanthanum titanate (PLZT), and dielectric metal oxynitrides, such as hafnium oxynitride ($HfO_2$—N) or nitrides of hafnium silicate (HfSiO—N). Note that while FIG. 4 depicts the discontinuous component 422 to be the minority component and to be substantially evenly dispersed within the continuous component 421, the discontinuous component 422 may constitute more than half of the volume of the floating-gate layer 420 and/or may be concentrated in one or more portions of the floating-gate layer 420, such as near a surface or edge of the floating-gate layer 420 or between layers (not shown in FIG. 4) of the continuous component 421.

By increasing the effective surface area of the conductive continuous component 421, additional trapping states are formed in the floating-gate layer 420, thus facilitating increased charge carrier storage for a given volume of the floating-gate layer 420. However, because increasing levels of the dielectric discontinuous component 422 will decrease the volume of the conductive continuous component 421, a balance should be struck to avoid increasing the trapping states beyond a point where the conductive continuous layer 421 reaches a limit of charge state density such that further increases in trapping states will result in a decrease in the ability of the floating-gate layer 420 to hold charge carriers. For one embodiment, the dielectric discontinuous component 422 is about 20% or more of the volume of the floating-gate layer 420. For a further embodiment, the dielectric discontinuous component 422 is about 85% or less of the volume of the floating-gate layer 420.

The intergate dielectric layer 425 is formed overlying the floating-gate layer 420. The intergate dielectric layer 425 contains a dielectric material. Some examples include silicon oxides, silicon nitrides or silicon oxynitrides. Further examples include dielectric metal oxides such as barium strontium titanate (BST), lead zirconium titanate (PZT) and lead lanthanum titanate (PLZT). Dielectric layers may further contain multiple layers of dielectric materials. One common example is an ONO (oxide-nitride-oxide) dielectric layer.

A control-gate layer 430 is formed overlying the intergate dielectric layer 425. The control gate layer 430 is generally one or more layers of conductive material. For one embodiment, the control gate layer 430 contains a conductively-doped polysilicon. For a further embodiment, the control gate layer 430 includes a metal-containing layer overlying a polysilicon layer, e.g., a refractory metal silicide layer formed on a conductively-doped polysilicon layer. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. For another embodiment, the control gate layer 430 contains multiple metal-containing layers, e.g., a titanium nitride (TiN) barrier layer overlying the intergate dielectric layer 425, a titanium (Ti) adhesion layer overlying the barrier layer and a tungsten (W) layer overlying the adhesion layer.

A cap layer 435 is generally formed overlying the control-gate layer 430 to act as an insulator and barrier layer to protect the control-gate layer 430 during subsequent processing. The cap layer 435 contains a dielectric material and may include such dielectrics as silicon oxide, silicon nitride, and silicon oxynitrides. For one embodiment, the cap layer 435 is silicon nitride, formed by such methods as CVD.

The gate stack, i.e., tunnel dielectric layer 410, floating-gate layer 420, intergate dielectric layer 425, control-gate layer 430 and cap layer 435, may be patterned to define word lines of a memory device. It is noted that additional layers may form the gate stack, such as barrier layers to inhibit diffusion between opposing layers or adhesion layers to promote adhesion between opposing layers. Sidewall spacers 440 may be formed on the sidewalls of the gate stacks to protect and insulate the sidewalls. Sidewall spacers 440 are typically the same dielectric material as used for the cap layer 435, but may include other dielectric materials. Formation may include a blanket deposit of a layer of dielectric material on the patterned gate stacks followed by an anisotropic etch to preferentially remove horizontal portions of the layer of dielectric material, leaving vertical portions adjacent the sidewalls of the gate stacks.

FIGS. 5A-5E generally depict a method of forming a portion of a memory array in accordance with one embodiment of the invention. Guidelines for materials of construction may generally be the same as provided with reference to FIG. 4.

Figure 5A:
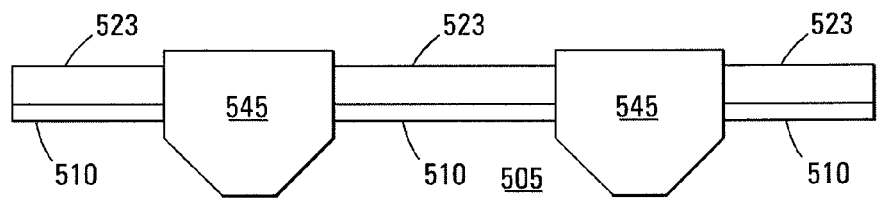
FIGS. 5A-5E are cross-sectional views of a memory cell at various stages of fabrication in accordance embodiments of the invention.

FIG. 5A depicts a portion of the memory array after several processing steps have occurred. Formation of the type of structure depicted in FIG. 5A is well known and will not be detailed herein. In general, FIG. 5A depicts a substrate 505 upon which tunnel dielectric layer 510 and an optional first conductive layer 523 have been formed. The tunnel dielectric layer 510 is formed overlying an active region of the substrate 505, over which memory cells will be formed. Isolation regions 545 are formed in the substrate 505. For the embodiment as shown in FIG. 5A, the isolation regions 545 are shallow-trench isolation (STI) regions, commonly formed by creating a trench in the substrate 505 and filling the trench with a dielectric material.

The tunnel dielectric layer 510 might be formed by thermal oxidation of the silicon substrate 505. Alternatively, the tunnel dielectric layer 510 could be formed by a blanket deposition of a dielectric material, such as by chemical vapor deposition (CVD) or physical vapor deposition (PVD).

The isolation regions 545 are generally sized to provide an appropriate amount of isolation between the channel regions of adjacent memory cells. However, this can have the effect of limiting the length of the floating gate. To overcome this issue, the floating gate is often formed as more than one conductive layer, i.e., one layer formed between the isolation regions 545 and a second layer formed to overlie a portion of the isolation regions 545. The conductive layer 523 may be used to form a first portion of a floating-gate layer for the future floating-gate memory cells. For one embodiment, the first conductive layer 523 contains a conductive continuous component as described with reference to FIG. 4. However, the first conductive layer 523 may or may not have a discontinuous dielectric component at this stage in fabrication. For one embodiment, the first conductive layer 523 is formed to include both a conductive continuous component and a dielectric discontinuous component. As one example, first conductive layer 523 could be formed by PVD, such as sputtering from a composite target containing both the conductive and dielectric components. As a second example, first conductive layer 523 could be formed as a series of alternating sub-layers of conductive material and dielectric material as described in more detail with reference to FIG. 6.

Figure 5B:
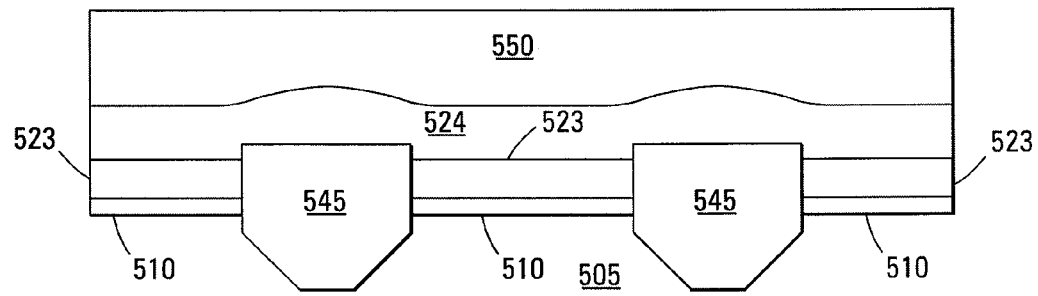

FIG. 5B depicts the formation of a second conductive layer 524 and a hard mask layer 550. For one embodiment, the first conductive layer 523 and the second conductive layer 524 form a floating-gate layer. For one embodiment, the second conductive layer 524 contains a conductive continuous component as described with reference to FIG. 4. However, the second conductive layer 524 may or may not have a discontinuous dielectric component at this stage in fabrication. For one embodiment, the first conductive layer 524 is formed to include both a conductive continuous component and a dielectric discontinuous component. In general, hard mask layer 550 is included to protect the underlying second conductive layer 524 during subsequent processing. For one embodiment, the hard mask layer 550 is a silicon nitride.

Figure 5C:
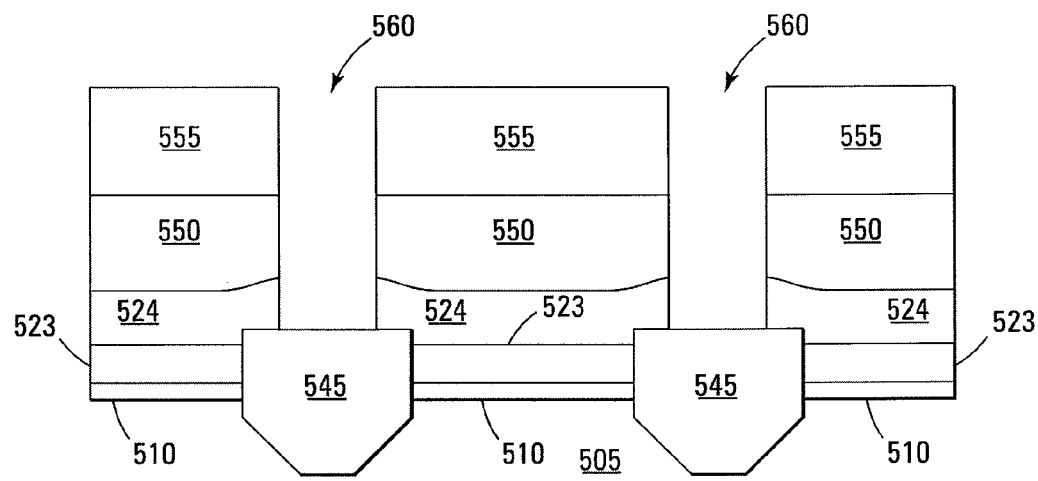

In FIG. 5C, a second mask layer 555 is formed and patterned overlying the hard mask layer 550. Subsequently, portions of the hard mask layer 550 and the second conductive layer 524 are removed, leaving the isolation regions 545 covered by the second conductive layer 524, i.e., leaving the isolation regions 545 unexposed. As one example, a photolithographic resist material could be deposited as second mask layer 555 overlying the hard mask layer 550, exposed to a radiation source, such as UV light, and developed to define areas 560 overlying the isolation regions 545 for removal of the exposed portions of the hard mask layer 550 and second conductive layer 524. For one embodiment, the areas 560 are overlying the isolation regions 545. For a further embodiment, the widths of the isolation regions 545 may be greater than or less than a width of the isolation regions 545. However, by choosing a width of less than a width of the isolation regions 545, the effective width, and thus effective coupling area, of the future floating gate may be increased.

Following this patterning of the second mask layer 555, exposed portions of the hard mask layer 550 and second conductive layer 524 may be removed, such as by etching or other removal process. For one embodiment, etches of the hard mask layer 550 and of the second conductive layer 524 could be performed using a first etch selective to the material of the hard mask layer 550, using the second conductive layer 524 as a stopping layer, and a second etch selective to the material of the second conductive layer 524, using the isolation regions 545 as a stopping layer.

Figure 5D:
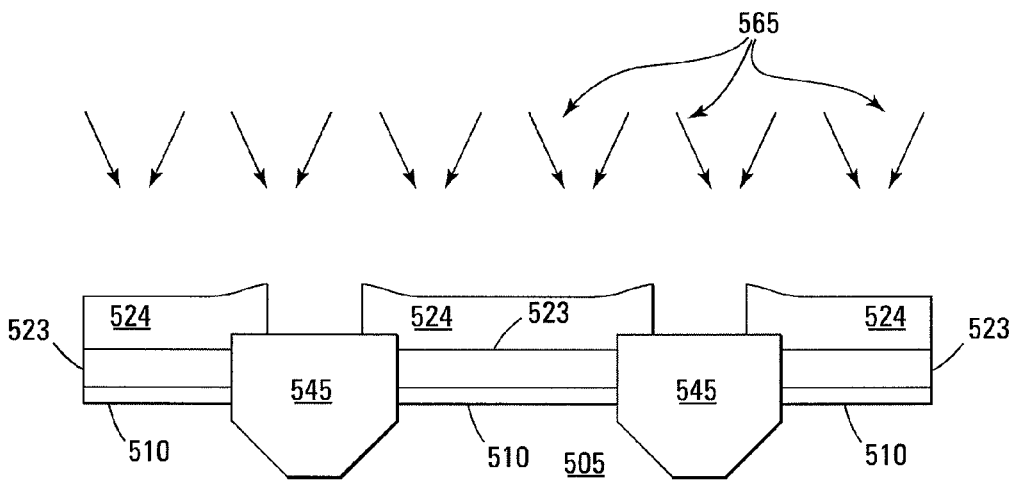
Figure 5E:
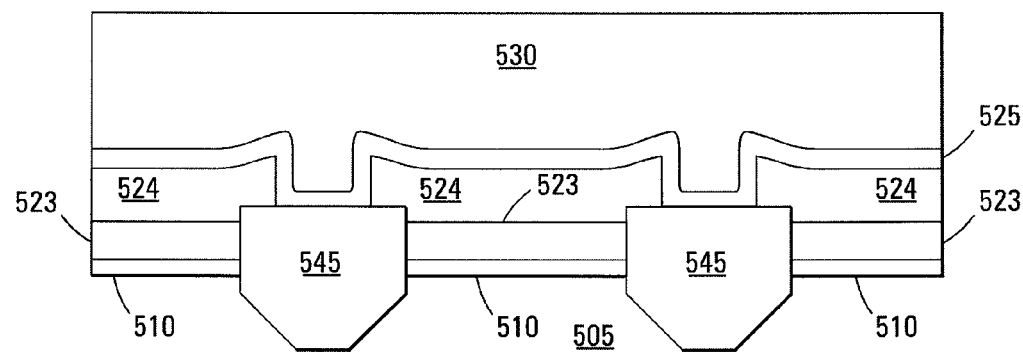

In FIG. 5D, the second mask layer 555 and hard mask layer 550 are removed, exposing the second conductive layer 524. If the first conductive layer 523 and/or the second conductive layer 524 were not previously formed to include a dielectric discontinuous component, the dielectric discontinuous component could be formed at this stage of fabrication in accordance with one embodiment. For example, reactive species, represented conceptually by lines 565, could be implanted into one or all of the conductive layers of the floating-gate layer to form the dielectric discontinuous component in situ. For one embodiment, the reactive species includes molecular, atomic and/or ionic species capable of reacting with the material of the first conductive layer 523 and/or the second conductive layer 524. Note that while implantation of species 565 may occur in each layer of the floating-gate, it is possible to control the energy of implantation such that the reactive species 565 lodge predominantly or even exclusively in only one layer, e.g., second conductive layer 524. For a further embodiment, the reactive species include forms of oxygen and/or nitrogen. As an example, if one or more of the conductive layers of the floating-gate layer includes a polysilicon or silicon-germanium material, implantation of oxygen or nitrogen could be used to form crystals of silicon oxide or nitride and/or germanium oxide or nitride, respectively. Formation of the oxide or nitride crystals would generally occur upon annealing of the substrate. For one embodiment, the energy and level of implantation are sufficiently low to allow implantation of the reactive species 565 in one or more of the conductive layers 523 and 524 while maintaining their conductivity following an anneal process to convert a portion of one or more of the conductive layers 523 and 524 to a dielectric form. For a further embodiment, the implantation is a low-energy implantation, e.g., below 10 KeV, with a dosage level of below about $10^{16}/cm^2$. However, the appropriate energy and level of implantation will be determined based upon the chosen materials construction and their respective thicknesses along with the chosen reactive species.

It is noted that incorporating nitrogen into the first conductive layer 523 and/or the second conductive layer 524 may be beneficial even if a dielectric discontinuous component has already been formed. For example, nitrogen may tend to migrate or collect at interfaces between the dielectric discontinuous component and the conductive continuous component. This is particularly true with high-K dielectrics like $HfO_2$. Additionally, for dielectrics such as $Al_2O_3$, where a negative fixed charge is often initially present after formation, the presence of nitrogen in the first conductive layer 523 and/or the second conductive layer 524 may tend to reduce this charge.

To complete the formation of the memory cells, an intergate dielectric layer 525 is formed overlying the second conductive layer 524. The control gate layer 530 is formed overlying the intergate dielectric layer 525 and patterned to define word lines of the memory device. It is noted that FIGS. 5A-5E depict a portion of a row of memory cells running parallel to a face plane of the drawings. Columns of memory cells, separated by the isolation regions 545 run perpendicular to the drawings, with source and drain regions formed at opposing ends of the tunnel dielectric layer 510, one above the face plane of the figures and one below the face plane of the figures. It is noted that FIGS. 5A-5E can depict either a NOR-type memory device or a NAND-type memory device, with the differences occurring in the column direction in manners that are well understood in the art of memory fabrication.

Figure 6:
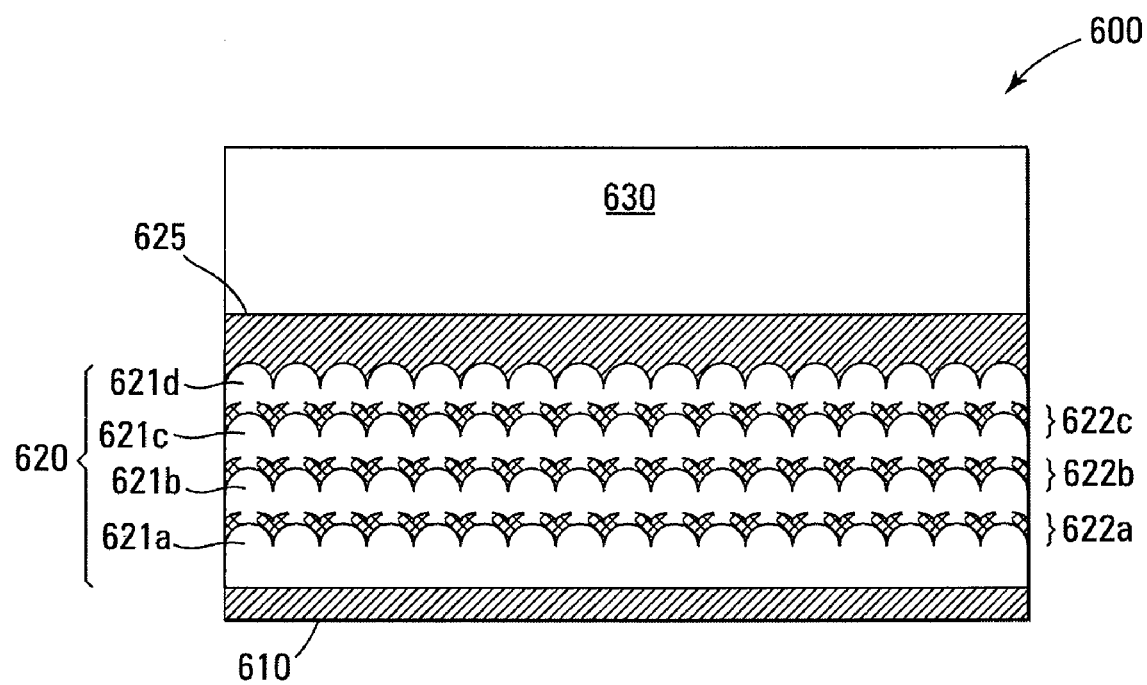
FIG. 6 is a cross-sectional view of a portion of a memory cell in accordance with another embodiment of the invention.

FIG. 6 is a cross-sectional view of a portion of a memory cell in accordance with another embodiment of the invention. The portion of the memory cell shown in FIG. 6 generally corresponds to the gate stack 600 of the memory cell. Guidelines for materials of construction may generally be the same as provided with reference to FIG. 4.

The gate stack 600 includes a tunnel dielectric layer 610, a floating-gate layer 620, an intergate dielectric layer 625 and a control-gate layer 630. The floating-gate layer 620 includes two or more layers of a conductive continuous component 621 and one or more layers of a dielectric discontinuous component 622.

For the embodiment depicted in FIG. 6, the floating-gate layer 620 has been formed as a series of alternating layers of conductive material and dielectric material. For example, a first conductive layer 621a may be formed overlying the tunnel dielectric layer 610. For one embodiment, the first conductive layer 621a is a hemispherical-grain polysilicon material.

Following formation of the first conductive layer 621a, a first dielectric layer 622a is formed overlying the first conductive layer 621a. The first dielectric layer 622a is formed to be discontinuous, i.e., portions of the surface of the first conductive layer 621a remain exposed following formation of the first dielectric layer 622a. For one embodiment, forming a discontinuous layer includes formation of the first dielectric layer 622a by atomic layer deposition (ALD) or other CVD process having sufficient control of deposition rates that deposition can be stopped prior to forming a continuous layer of dielectric material. For example, with an underlying layer of hemispherical-grain polysilicon, CVD processes may preferentially deposit materials at grain boundaries as nucleation sites. This would result in small pockets of dielectric material at the grain boundaries while leaving portions of the polysilicon layer exposed. Evaporative or other PVD processes could also be used to form a discontinuous dielectric layer by terminating the deposition process before sufficient dielectric material has been deposited to form a continuous layer. The first dielectric layer 622a may be a number of islands or crystals of dielectric material dispersed on the surface of the first conductive layer 621a. Alternatively, the first dielectric layer 622a may be a contiguous film of dielectric material with a number of discontinuities exposing portions of the underlying first conductive layer 621a.

Following formation of the first dielectric layer 622a, a second conductive layer 621b is formed that is overlying the first dielectric layer 622a while being coupled to the first conductive layer 621a. The dielectric layers (622b and 622c) and conductive layers (621b, 621c and 621d) may be formed as described with reference to first dielectric layer 622a and first conductive layer 621a, respectively. For a further embodiment, the processing as described with reference to the floating-gate layer 620 may be used to form each conductive layer of the floating gate, such as both layers 523 and 524 of FIG. 5E, or the processing as described with reference to the floating-gate layer 620 may be used to form less than each conductive layer of the floating gate, such as either layer 523 or 524 of FIG. 5E. In addition, implantation of reactive species, such as described with reference to FIG. 5D, may be used in addition to the multi-layer construction of floating-gate layer 620 to produce a dielectric discontinuous component in one or more of the conductive layers 621a-621d.

By providing a dielectric discontinuous component in a conductive floating gate, an increase in charge trapping sites may be facilitated, thus resulting in an increase in charge density in the floating-gate. An increase in charge density could allow for a reduction in the thickness of the floating gate, which, in turn, could reduce floating-gate induced interference and improve the coupling ratio between the floating gate and the control gate. These aspects could allow for further reductions of scale for floating-gate memory devices.

By increasing charge trapping sites, charge retention characteristics may also be improved. The increased density of trap sites at a deeper trap energy level, i.e., interface states at the surface of the islands of dielectric material within the conductive continuous portion, may also facilitate lower operating voltages by allowing thinner tunnel dielectric layers.

While methods for programming and erasing standard floating-gate memory cells would generally apply to floating-gate memory cells in accordance with the various embodiments, it is believed that floating-gate memory cells in accordance with the various embodiments may be generally more difficult to erase due to increased charge retention characteristics. This concern can be mitigated to some degree by utilizing a p+ conductivity in the floating gate in conjunction with a Fowler-Nordheim tunneling over the entire channel area for erasure.

CONCLUSION

Floating-gate memory cells having a floating gate with a conductive portion and a dielectric portion facilitate increased levels of charge trapping sites within the floating gate. The conductive portion includes a continuous component providing bulk conductivity to the floating gate. The dielectric portion is discontinuous within the conductive portion and may include islands of dielectric material and/or one or more contiguous layers of dielectric material having discontinuities.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A floating-gate memory cell, comprising:
a tunnel dielectric overlying a semiconductor substrate;
a floating gate overlying the tunnel dielectric, wherein the floating gate comprises a conductive material and a discontinuous dielectric material formed within the conductive material as a reaction product of the conductive material;
an intergate dielectric overlying the floating gate;
a control gate overlying the intergate dielectric; and
source/drain regions formed in the substrate adjacent the tunnel dielectric;
wherein a portion of the conductive material is overlying a portion of the discontinuous dielectric material, between the intergate dielectric and the portion of the discontinuous dielectric material.

2. The floating-gate memory cell of claim 1, wherein the conductive material comprises at least one material selected from the group consisting of an n+ polysilicon material, a p+ polysilicon material, an n+ silicon-germanium material, a p+ silicon-germanium material, a metal, a metal carbide, a metal nitride, a metal silicide and a metal carbon nitride.

3. The floating-gate memory cell of claim 1, wherein the reaction product of the conductive material is an oxide, nitride and/or oxynitride form of the conductive material.

4. The floating-gate memory cell of claim 1, wherein the dielectric material is formed within the conductive material by implanting a reactive species in the conductive material and reacting the reactive species with the conductive material.

5. The floating-gate memory cell of claim 4, wherein the implanted reactive species are evenly dispersed within the conductive material.

6. The floating-gate memory cell of claim 4, wherein the implanted reactive species are concentrated in one or more portions of the conductive material.

7. The floating-gate memory cell of claim 6, wherein the implanted species are concentrated near a surface or edge of the conductive material.

8. The floating-gate memory cell of claim 1, wherein the dielectric material constitutes more than 20% of a volume of the floating gate and less than 85% of the volume of the floating gate.

9. The floating-gate memory cell of claim 1, wherein the floating gate comprises two or more layers of conductive material.

10. The floating-gate memory cell of claim 9, wherein at least one of the layers of conductive material has a dielectric material formed therein.

11. The floating-gate memory cell of claim 10, wherein less than all of the layers of conductive material have a dielectric material formed therein.

12. A floating-gate memory cell, comprising:
a tunnel dielectric overlying a semiconductor substrate;
a floating gate overlying the tunnel dielectric, wherein the floating gate comprises a conductive material and pockets of dielectric material formed at grain boundaries of the conductive material;
an intergate dielectric overlying the floating gate;
a control gate overlying the intergate dielectric; and
source/drain regions formed in the substrate adjacent the tunnel dielectric;
wherein the pockets of dielectric material are separated from the intergate dielectric by the conductive material.

13. The floating-gate memory cell of claim 12, wherein the conductive material is hemispherical grain polysilicon.

14. The floating-gate memory cell of claim 12, wherein the pockets of dielectric material comprise a high-K dielectric selected from the group consisting of a dielectric metal oxides and dielectric metal oxynitrides.

15. The floating-gate memory cell of claim 14, wherein the pockets of dielectric material comprise hafnium oxynitride and/or nitrides of hafnium silicate.

16. The floating-gate memory cell of claim 12, wherein the floating gate comprises two or more layers of conductive material.

17. The floating-gate memory cell of claim 16, wherein less than all of the layers of conductive material have pockets of dielectric material formed at their grain boundaries.

18. A memory device, comprising:
an array of floating-gate memory cells; and
circuitry for control and/or access of the array of floating gate memory cells;
wherein the at least one memory cell of the array of floating-gate memory cells comprises:
a gate stack having sidewalls and comprising:
a tunnel dielectric overlying a semiconductor substrate;
a floating gate overlying the tunnel dielectric, wherein the floating gate comprises a conductive continuous component and a dielectric discontinuous component within the conductive continuous component;
an intergate dielectric overlying the floating gate;
a control gate overlying the intergate dielectric; and
a dielectric cap overlying the control gate;
a first dielectric spacer adjacent a first sidewall of the gate stack;
a second dielectric spacer adjacent a second sidewall of the gate stack; and
source/drain regions formed in the substrate adjacent the first and second sidewalls of the gate stack;
wherein the floating gate is conductive in a direction extending from the tunnel dielectric to the intergate dielectric; and
wherein the floating gate is conductive in a direction extending from the first dielectric spacer to the second dielectric spacer.

19. The memory device of claim 18, wherein the floating gate of the at least one memory cell comprises two or more layers of conductive material.

20. The memory device of claim 18, wherein the conductive continuous component comprises at least one conductive material selected from the group consisting of a silicon-based material, a silicon-germanium material, a metal, a metal carbide, a metal nitride, a metal silicide or a metal carbon nitride.

21. The memory device of claim 18, wherein the dielectric discontinuous component comprises one or more dielectric materials selected from the group consisting of silicon oxide, silicon nitride, silicon oxynitride, dielectric metal oxides, barium strontium titanate, lead zirconium titanate, lead lanthanum titanate, dielectric metal oxynitrides, hafnium oxynitride and nitrides of hafnium silicate.

22. The memory device of claim 18, wherein the dielectric discontinuous component comprises islands of dielectric material dispersed within the conductive continuous component.

23. The memory device of claim 22, wherein the islands of dielectric material are dielectric forms of the conductive continuous component.

24. The memory device of claim 18, wherein the dielectric discontinuous component comprises one or more contiguous layers of dielectric material having discontinuities and formed between layers of the conductive continuous component.

25. A floating-gate memory cell, comprising:
a tunnel dielectric overlying a semiconductor substrate;
a floating gate overlying the tunnel dielectric, wherein the floating gate comprises a conductive material and a discontinuous dielectric material formed within the conductive material as a reaction product of the conductive material;
an intergate dielectric overlying the floating gate;
a control gate overlying the intergate dielectric; and
source/drain regions formed in the substrate adjacent the tunnel dielectric;
wherein the floating gate comprises two or more layers of conductive material;
wherein at least one layer and less than all of the layers of conductive material has a dielectric material formed therein.

26. A floating-gate memory cell, comprising:
a tunnel dielectric overlying a semiconductor substrate;
a floating gate overlying the tunnel dielectric, wherein the floating gate comprises a conductive material and pockets of dielectric material formed at grain boundaries of the conductive material;
an intergate dielectric overlying the floating gate;
a control gate overlying the intergate dielectric; and
source/drain regions formed in the substrate adjacent the tunnel dielectric;
wherein the floating gate comprises two or more layers of conductive material; and
wherein less than all of the layers of conductive material have pockets of dielectric material formed at their grain boundaries.

* * * * *